US009628195B2

(12) United States Patent
Jiang et al.

(10) Patent No.: US 9,628,195 B2
(45) Date of Patent: Apr. 18, 2017

(54) TRANSIMPEDANCE AMPLIFIER (TIA) HAVING AN ENLARGED DYNAMIC RANGE AND OPTICAL DEVICES USING THE SAME

(71) Applicant: SOURCE PHOTONICS (CHENGDU) CO., LTD., Chengdu, Sichuan (CN)

(72) Inventors: Xu Jiang, Chengdu (CN); Yuan Song, Chengdu (CN); Shuyuan Zhang, Chengdu (CN); Yuanzhong Xu, Chengdu (CN)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 240 days.

(21) Appl. No.: 14/522,384

(22) PCT Filed: Oct. 22, 2014

(86) PCT No.: PCT/CN2014/089125
§ 371 (c)(1),
(2) Date: Oct. 23, 2014

(87) PCT Pub. No.: WO2016/061748
PCT Pub. Date: Apr. 28, 2016

(65) Prior Publication Data
US 2016/0268981 A1    Sep. 15, 2016

(51) Int. Cl.
*H04B 10/69* (2013.01)
*H03K 3/037* (2006.01)
(Continued)

(52) U.S. Cl.
CPC ......... *H04B 10/6931* (2013.01); *H03F 1/083* (2013.01); *H03F 3/087* (2013.01);
(Continued)

(58) Field of Classification Search
CPC ....... H04B 10/69–10/6973; H03F 3/08–3/087; H03G 3/3084
See application file for complete search history.

(56) References Cited

U.S. PATENT DOCUMENTS 6,246,282 B1 * 6/2001 Oono ..................... H03F 3/087
                                                250/214 A
6,303,922 B1 * 10/2001 Kasper ................... H03F 3/087
                                                250/214 A
(Continued)

FOREIGN PATENT DOCUMENTS

CN   102324899 A    1/2012
EP   2388933 A1    11/2011
(Continued)

OTHER PUBLICATIONS

Yan Song et al.; "Transresistance Amplifier With Received Signal Strength Indication (RSSI) Function"; Bibliographic Data of CN102324899 (A); Jan. 18, 2012; http://worldwide.espacenet.com.
(Continued)

*Primary Examiner* — David Payne
*Assistant Examiner* — Casey Kretzer
(74) *Attorney, Agent, or Firm* — Andrew D. Fortney; Central California IP Group, P.C.

(57) ABSTRACT

A gain-variable trans-impedance amplifier (TIA) in optical device is disclosed. The TIA has an improved dynamic range for receiving electrical signals and is configured to convert current signals from an avalanche photodiode (APD) to voltage signals. A resistor element is between the input and output terminals of the TIA, wherein the resistance of the resistor element can regulate the resistance and/or impedance value of the TIA, and a switch determines or controls the resistance of the resistor element. When the power of an optical signal received by the APD is higher than a predetermined value, the resistance becomes smaller and the gain
(Continued)

of the TIA becomes greater. When the power of the optical signal is lower than the predetermined value, the resistance becomes greater. The gain of the TIA is automatically adjusted on the basis of the intensity of received optical signals to obtain a greater dynamic operational range.

20 Claims, 4 Drawing Sheets (51) Int. Cl.
H03F 1/08 (2006.01)
H03F 3/45 (2006.01)
H03F 3/08 (2006.01)

(52) U.S. Cl.
CPC ....... *H03F 3/45475* (2013.01); *H03K 3/0377* (2013.01); *H03F 2203/45522* (2013.01); *H03F 2203/45528* (2013.01); *H03F 2203/45536* (2013.01)

(56) References Cited

U.S. PATENT DOCUMENTS

| 6,933,786 | B1* | 8/2005 | Mohandas | H03F 1/56 |
| | | | | 250/214 A |
| 6,982,582 | B1* | 1/2006 | Cheng | H03K 3/02337 |
| | | | | 327/205 |
| 7,493,053 | B2 | 2/2009 | Liu et al. | |
| 8,653,433 | B2 | 2/2014 | Mashimo et al. | |
| 2006/0067710 | A1 | 3/2006 | Liu et al. | |
| 2006/0170462 | A1* | 8/2006 | Bhattacharya | H03K 3/3565 |
| | | | | 327/77 |
| 2007/0247211 | A1* | 10/2007 | Brindle | H03K 17/687 |
| | | | | 327/365 |
| 2008/0308713 | A1* | 12/2008 | Keith | H03G 3/3084 |
| | | | | 250/214 A |
| 2010/0283543 | A1* | 11/2010 | Shivaram | H03F 1/083 |
| | | | | 330/254 |
| 2011/0291766 | A1 | 12/2011 | Mashimo et al. | |
| 2012/0235739 | A1* | 9/2012 | Griesdorf | G01N 27/3273 |
| | | | | 330/129 |
| 2013/0336650 | A1* | 12/2013 | Azadeh | H04B 10/40 |
| | | | | 398/38 |
| 2014/0002116 | A1* | 1/2014 | Wuerstlein | G01R 27/2605 |
| | | | | 324/681 |
| 2014/0263946 | A1* | 9/2014 | Nguyen | G01J 1/44 |
| | | | | 250/206 |

FOREIGN PATENT DOCUMENTS

JP 2008236455 A 10/2008
WO 2006039203 A1 4/2006

OTHER PUBLICATIONS

Nishihara Susumu et al.; "Transimpedance Amplifier and Control Method of Transimpedance Amplifier"; Bibliographic Data of JP2008236455 (A); Oct. 2, 2008; 2 pages.; http://worldwide.espacenet.com.

PCT International Search Report and Written Opinion; PCT International Searching Authority/CN dated Jul. 17, 2015; International Application No. PCT/CN2014/089125; 11 pages; International Searching Authority/State Intellectual Property Office of the P.R. China; Beijing, China.

* cited by examiner

TRANSIMPEDANCE AMPLIFIER (TIA) HAVING AN ENLARGED DYNAMIC RANGE AND OPTICAL DEVICES USING THE SAME

FIELD OF THE INVENTION

The present invention relates to the field of optical communication devices. More specifically, embodiments of the present invention pertain to circuits configured to enlarge the dynamic range of trans-impedance amplifiers (TIAs) in optical devices.

DISCUSSION OF THE BACKGROUND

Optical transceivers send and receive optical data over an optical link, such as a fiber-optic link. An optical transmitter can include laser driver circuitry to drive a laser diode, such as a light-emitting diode (LED), to create optical pulses or signals on the fiber-optic link from received electronic signals. An optical receiver can include a photodiode to receive the optical signals, which are then converted into electronic signals. Thus, an optical transceiver converts (i) optical signals into analog and/or digital electronic signals and (ii) electronic signals into optical signals.

The receiver (RX) of an optical transceiver generally comprises at least one photodiode or photoelectric detector, at least one TIA and at least one linear amplifier (LA). In addition, the strength of circuit noise is determined by the size of and bias voltage on one or more transistors of the TIA. The bandwidth of the TIA for a predetermined data processing technique can be influenced by the size of the TIA transistor(s) and the bias voltage on the TIA transistor(s). In order to provide TIAs with greater gain and sensitivity, the impedance of feedback resistors can be increased. In general, the gain of TIAs is substantially constant. If the gain of the TIA is too great, the sensitivity requirement for low power optical input signals can be met, but the TIA will be fully overloaded or saturated if optical input power is above a certain power. On the other hand, if the gain of TIA is low, the overload requirement for high power optical input signals can be met, but the TIA will not be sufficiently sensitive if the optical input power is below a certain power.

To improve the capability of the TIA, CN patent application CN1523753A discloses a design using a feedback resistance network to achieve dynamic control of TIA. In the design, the strength of the gain of TIAs can be dynamically regulated by the resistance value of resistors in parallel under the control of a switch. In addition, the overcapacity and sensitivity of TIAs can both be considered.

SUMMARY OF THE INVENTION

The present invention is intended to overcome one or more deficiencies in the prior art, providing a TIA having dynamic gain and optical devices using the same.

In one embodiment, a TIA having an improved dynamic range can include a current amplifier configured to produce an amplified voltage signal from a received current, wherein the current amplifier has a reference voltage input terminal, another input terminal and an output terminal; an impedor (e.g., an impedance device) having an adjustable value (e.g., an adjustable resistance and/or impedance) between the input terminal and the output terminal of the TIA, and a switch configured to determine or control the adjustable value of the impedor. The resistance of the impedor decreases when a power of a received optical signal (e.g., from which the received current is generated) is greater than a predetermined value, and the resistance of the impedor increases when the power of the received optical signal is lower than the predetermined value. For example, the impedor may be or comprise a component such as an inductor or resistor that offers an impedance (e.g., at the input and/or output of the TIA). The reference voltage may be determined and/or provided by a microcontroller unit (MCU) or other processor or logic circuit.

Optimized embodiments of the invention may comprise those in which the impedor comprises N parallel resistors (e.g., in parallel between the input terminal and the output terminal of the TIA), wherein at least one first resistor connects the input terminal and output terminal of the TIA, and at least one second resistor has a first terminal connected to one of the input terminal and output terminal of the TIA and a second terminal connected to the switch. N is an integer that is equal to or greater than 2. In one example, N=2. Further, the switch may be enabled or disabled by a control voltage (e.g., V_CTR).

Further, the first resistor and the second resistor may have a resistance value ratio in a range from 1:5 to 1:10, which provides at least two gain ranges for the TIA with an overlap region in the gain ranges sufficient to leave no gap between the gain ranges when switching over from one configuration (or range) to the other, and which can maximize the coverage of the gain ranges.

The TIA may further comprise a hysteresis circuit configured to regulate the control voltage (e.g., at an output terminal of the hysteresis circuit) by comparing an input voltage with at least one predetermined value, the predetermined value(s) comprising high and low predetermined values that may be configured by a plurality of hysteresis resistors (e.g., R4, R5 and Rf). When the input voltage at the hysteresis circuit is greater than the high predetermined value, the control voltage from the hysteresis circuit turns on or enables the switch, and when the input voltage at the hysteresis circuit is less than the high predetermined value, the control voltage turns off or disables the switch.

The hysteresis circuit may comprise an amplifier and a plurality of hysteresis resistors. The amplifier has a first input terminal, a second input terminal and an output terminal. The plurality of hysteresis resistors comprises a third resistor (e.g., Rf) connected between the first input terminal and the output terminal of the amplifier, a fourth resistor (e.g., R4) connected in series to the second input terminal of the amplifier, and a fifth resistor (e.g., R5) connected between a reference voltage and the first input terminal. The amplifier may be configured to receive an output from a current mirror, and thus may connect the current mirror and a boost circuit in an optical device. The high and low predetermined values may be determined by the third, fourth and fifth hysteresis resistors (e.g., R4, R5 and Rf) of the hysteresis circuit.

The present invention further provides an optical receiver comprising the TIA and a photodiode, wherein the input terminal of the current amplifier is connected to the photodiode. Further, in the optical receiver, the switch of the TIA is enabled or disabled by a control voltage (e.g., V_CTR). The TIA may further comprise a hysteresis circuit configured to regulate the control voltage (e.g., at an output terminal of the hysteresis circuit) by comparing an input voltage with at least one predetermined value, the predetermined value comprising high and low predetermined values configured by a plurality of resistors (e.g., R4, R5 and Rf) in the hysteresis circuit (e.g., under the control of a hysteresis level). When the input voltage to the hysteresis circuit is greater than the high predetermined value, the control voltage from the hysteresis circuit enables or turns on the switch, and when the input voltage to the hysteresis circuit is less than the low predetermined value, the control voltage disables or turns off the switch. The photodiode is also connected to a current mirror that may be, in turn, connected in series to a boost circuit. One terminal (e.g., an output) of the current mirror is connected to an input (e.g., providing, in combination with a resistor, an input voltage) to the hysteresis circuit.

The present invention further provides a received signal strength indicator (RSSI), comprising the TIA and the hysteresis circuit. One input terminal of the hysteresis circuit receives or is connected to a reference voltage, while another input terminal is connected to (or receives an output from) an analog amplifier circuit. One input terminal of the analog amplifier circuit connects to a photodiode and an optical receiver. The present invention further provides an optical receiver comprising the RSSI.

Relative to prior approaches, the present invention provides the following advantages: when the optical input power is at a high level, the gain of the TIA can be reduced by adjusting the resistance value of the impedor such that the distortion of the TIA from overload can be improved; when the optical input power is at a low level, the gain of the TIA can be increased by adjusting the resistance value of the impedor, thereby providing the TIA with high gain and ensuring a wide voltage swing output (e.g., gain range) and improving sensitivity over a relatively wide range of received optical signal strengths.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the disclosure.

Unless specifically stated otherwise, or as will be apparent from the following discussions, it is appreciated that throughout the present application, discussions utilizing terms such as "processing," "operating," "calculating," "determining," or the like, refer to the action and processes of a computer, data processing system, or similar processing device (e.g., an electrical, optical, or quantum computing or processing device or circuit) that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data or information similarly represented as physical quantities within other components of the same or a different system or architecture.

Furthermore, in the context of this application, the terms "signal" and "optical signal" refer to any known structure, construction, arrangement, technique, method and/or process for physically transferring a signal or optical signal, respectively, from one point to another. Also, unless indicated otherwise from the context of its use herein, the terms "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

For the sake of convenience and simplicity, the terms "optical" and "optoelectronic" are generally used interchangeably herein, and use of either of these terms also includes the other, unless the context clearly indicates otherwise, but these terms are generally given their art-recognized meanings herein. Furthermore, the term "transceiver" refers to a device having at least one receiver and at least one transmitter, and use of the term "transceiver" also includes the individual terms "receiver" and/or "transmitter," unless the context clearly indicates otherwise. Also, for convenience and simplicity, the terms "connected to," "coupled with," "communicating with," "coupled to," and grammatical variations thereof (which terms also refer to direct and/or indirect relationships between the connected, coupled and/or communicating elements unless the context of the term's use unambiguously indicates otherwise) may be used interchangeably, but these terms are also generally given their art-recognized meanings.

Various embodiments and/or examples disclosed herein may be combined with other embodiments and/or examples, as long as such a combination is not explicitly disclosed herein as being unfavorable, undesirable or disadvantageous. The invention, in its various aspects, will be explained in greater detail below with regard to exemplary embodiments.

A First Embodiment

Figure 1:
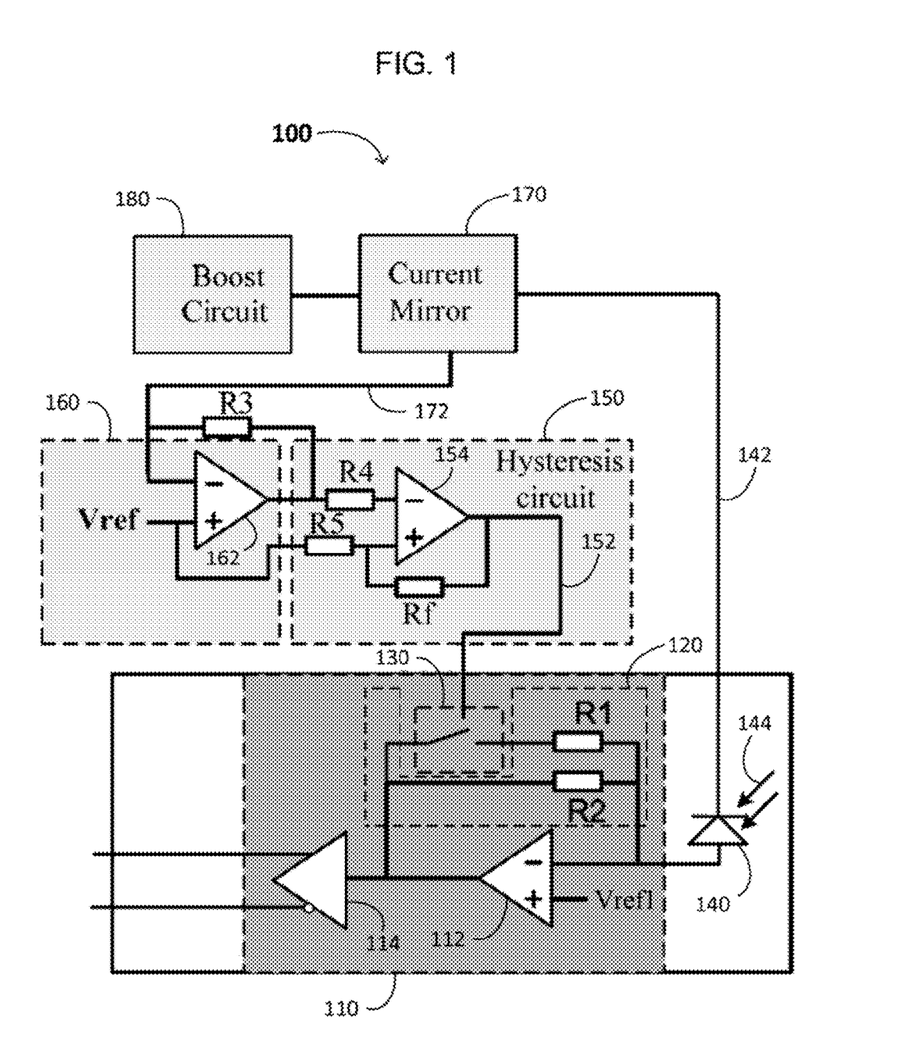
FIG. 1 is a first circuit diagram in accordance with embodiments of the present invention.

As shown in FIG. 1, an optical receiver 100 includes a TIA 110 having an improved dynamic range may include a current amplifier 112, an impedor 120, and a switch 130. The TIA 110 may further comprise a buffer 114 receiving an output of the current amplifier 112. In one embodiment, the buffer 114 is or comprises a differential output buffer (e.g., as shown), but which may also be or comprise a conventional single-ended buffer (i.e., providing a single-ended output signal, as opposed to a differential output signal). The TIA 100 is particularly useful in optical or optoelectronic devices, such as optical receivers and optical transmitters.

The current amplifier 112 has a reference voltage input terminal, a second input terminal, and an output terminal.

The current amplifier 112 is configured to produce an amplified current (e.g., at the output terminal) from a received bias current. In one example, the bias current is provided by a photodiode 140, which converts the received optical signal to an electrical signal (e.g., the bias current). The reference voltage (e.g., Vref1) at the reference voltage input terminal may be any voltage that results in amplification of the bias current. In various examples, the reference voltage Vref1 may be a ground potential (e.g., 0 V), an offset voltage (e.g., a voltage by which the signal from the photodiode 140 may have drifted from a predetermined voltage, such as 0 V), or another voltage that provides a desired or given result or function.

The impedor 120, in one embodiment, includes resistors R1 and R2, configured to be placed (e.g., to be connected) between the input and output terminals of the current amplifier 112. One terminal of the resistor R1 is connected in series with the switch 130, which is disabled or enabled by a control voltage (e.g., V_CTR), which may come from a controller such as a hysteresis circuit 150. The control voltage may come from a different controller (e.g., a microcontroller unit, a processor or other logic circuit) in alternative embodiments. In general, the control voltage is a digital signal, although it may be an analog signal in an alternative embodiment. The resistor R1 has a first terminal connected to the current input terminal of the amplifier 112 and a second terminal connected to the switch 130. The switch 130 has an input terminal connected to the second terminal of the resistor R1 and an output terminal connected to the output terminal of the amplifier 112. The switch 130 also has a control terminal receiving the control signal (e.g., V_CTR).

The resistors R1 and R2 may have different resistances. For example, the resistance of R1 may range from 1 to 10 k$\Omega$, and the resistance of R2 may range from 5 to 100 k$\Omega$. The ratio of the resistance of R1 to the resistance of R2 of the gain may range from 1:1 to 1:100, and in certain embodiments, may range from 1:5 to 1:10. The two resistors R1 and R2 and the switch 130 provide at least two gain ranges for the TIA 110, and the range of the resistance ratio of from 1:5 to 1:10 may provide an overlap region between the gain of the TIA 110 with the resistor R1 turned on and the gain of the TIA 110 with the resistor R1 turned off, thereby leaving no gap between the gain ranges of the TIA 110 when switching over from one configuration (e.g., switch 130 turned on) to the other (e.g., switch 130 turned off). Also, the range of the resistance ratio of from 1:5 to 1:10 may maximize the coverage of the two gain ranges.

In a further embodiment, the impedor 120 may further comprise a third resistor (not shown), in parallel with the resistors R1 and R2. The third resistor is in series with a second switch (not shown), which may receive the same or different control voltage as the switch 130. When the control voltage received by the second switch is the same as the control voltage received by switch 130, the control voltage may be a multi-bit digital signal provided by, e.g., an analog-to-digital converter receiving the output of the hysteresis circuit 150. Consequently, the present invention envisions a TIA with a digitally selectable dynamic gain range.

The hysteresis circuit 150 is configured to regulate the control voltage at its output terminal 152 by comparing an input voltage with one or more predetermined values. The input voltage is provided by passing a mirrored current 172 through a resistance (e.g., one or more resistors, one of which may receive an amplified current from a current amplifier 160). The mirrored current may be duplicated from (e.g., the same as, or an integer multiple or 1/n fraction of) the current at node 142, generated by the photodiode 140. The predetermined value(s) comprise high and low predetermined values. When the input voltage to the hysteresis circuit 150 is greater than the high predetermined value, the control voltage 152 from the hysteresis circuit 150 will be at a first digital logic state (e.g., a "1"), and the switch 130 is enabled or turned on. On the other hand, when the input voltage to the hysteresis circuit 150 is less than the low predetermined value, the control voltage 152 will be at a second digital logic state complementary to the first digital logic state (e.g., a "0"), and the switch 130 is disabled or turned off.

Figure 3:
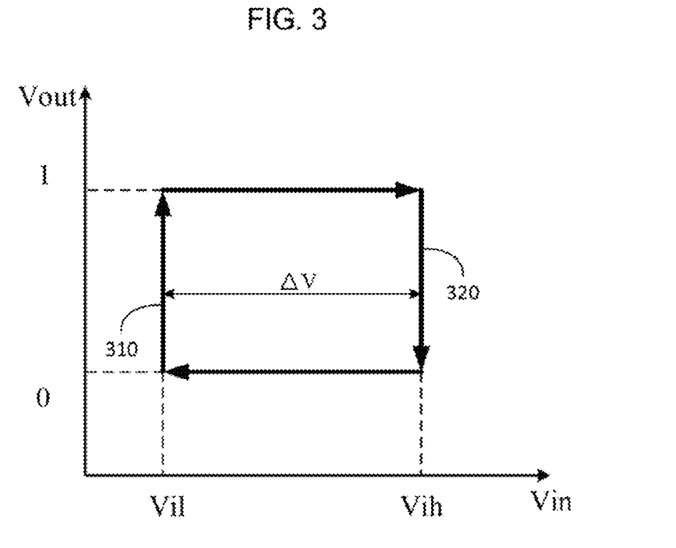
FIG. 3 is a graph showing results and/or buffer functionality of a hysteresis circuit in accordance with embodiments of the present invention.

Referring to FIG. 3, the control voltage V_CTR can be kept in the same status (e.g., active or inactive) after a given predetermined value or threshold (e.g., one of the high and low predetermined values) in the hysteresis circuit 150 is reached, until another predetermined value or threshold (e.g., the other of the high and low predetermined values) is reached. For example, when the input voltage Vin to the hysteresis circuit is at or below the low predetermined value Vil at 310, then the control voltage (e.g., Vout) transitions to a high digital logic state (1). As long as the input voltage Vin to the hysteresis circuit stays below the high predetermined value Vih, the control voltage (e.g., Vout) stays in the high digital logic state (1), and the TIA has a gain within a first range. When the input voltage Vin reaches or exceeds the high predetermined value Vih, the control voltage (e.g., Vout) transitions to a low digital logic state (0) at 320, and the TIA has a gain within a second range. As long as the input voltage Vin to the hysteresis circuit stays above the low predetermined value Vil, the control voltage (e.g., Vout) stays in the low digital logic state (0). In one example, the difference $\Delta V$ between the low and high predetermined values Vil and Vih is a value in a range that corresponds to an optical signal power range of from 3 to 9 dBm (e.g., 6 to 8 dBm).

Referring back to FIG. 1, the hysteresis circuit 150 may include an amplifier 154, a connecting resistor Rf, and input resistors R4 and R5. The amplifier 154 has a first input terminal receiving a voltage from input resistor R4, a second input terminal receiving a voltage from input resistor R5, and an output terminal providing the control voltage V_CTR at node 152. The input resistor R4 is serially connected to an amplification circuit 160 (e.g., an output of the amplifier 162) and a third resistor R3, which controls an impedance of the amplifier 162. The amplification circuit 160 may convert the mirrored current at 172 to a voltage. The input resistor R5 receives a reference voltage Vref and is connected to connecting resistor Rf, which is electrically connected between the second input terminal and the output terminal of the amplifier 154. In addition, the high and low predetermined values are determined by resistance values of R4, R5 and Rf. The analog amplifier 162 receives the output 172 from the current mirror 170, which is electrically connected to a conventional boost circuit 180 in the optical device 100. As previously described, the current mirror 170 is configured to duplicate the current on node 142 (or provide an integer multiple or 1/n integer fraction thereof) at node 172. The boost circuit 180 may be configured to increase a voltage or current provided to the current mirror 170.

In the first embodiment, the reference voltages Vref and Vref1 are determined by microcontroller unit (MCU) or other processor or logic circuit (not shown), may be an analog signal or value provided by a digital-to-analog converter (DAC) in the MCU, processor or logic circuit. The resistances R4, R5 and Rf may range from 1 to 10 k$\Omega$, 5 to 20 kΩ, or any other value within a range of from 1 to 100 kΩ, and a ratio of the resistances can be determined by a person skilled in the art based on appropriate, desired or predetermined high and low values of Vin and Vih (see FIG. 3) in the hysteresis circuit 150 (FIG. 1).

When the input power of the optical signal 144 received by the photodiode 140 is high, the control voltage V_CTR at 152 is set to an active digital logic state (e.g., a logic high), and the switch 130 is closed. As a result, the gain of the TIA 110 is decreased by the parallel connection of the resistors R1 and R2 between the input and output of the amplifier 112, and any distortion in the TIA 110 due to overload from the current provided by the photodiode 140 at the input to the amplifier 112 is reduced, eliminated, minimized or otherwise improved. When the input power of the optical signal 144 received by the photodiode 140 is low, the control voltage V_CTR at 152 is set to an inactive digital logic state (e.g., a logic low), and the switch 130 is opened, so the gain of the TIA 110 is relatively high. As a result, the TIA 110 also has high gain to ensure or guarantee a relatively high output swing voltage and improved sensitivity (e.g., relative to the same TIA with both resistors R1 and R2 connected in parallel).

The optical receiver 100 can also include a received signal strength indicator (RSSI) with very high dynamic range. The RSSI may comprise a trigger circuit, a sampler (e.g., a sample-and-hold circuit), an RSSI calculator, a memory (e.g., configured to store RSSI values), and/or an RSSI processor (e.g., to transmit RSSI information to a host or other receiver or transceiver in an optical network including the present receiver). When the input power of the optical signal is high, the amplifier (e.g., amplifier 112) has a high level output which makes the TIA gain relatively low. In turn, a response voltage of the RSSI can be in very large range, and the RSSI can operate without overload.

A Second Embodiment

Figure 2:
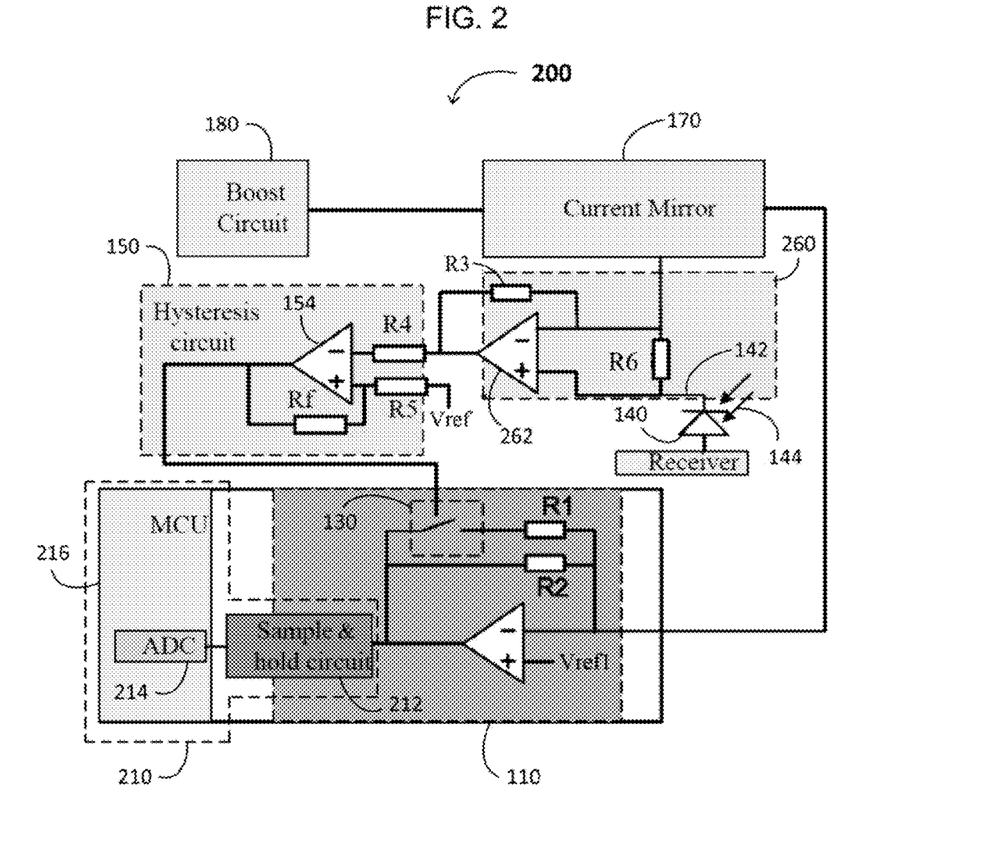
FIG. 2 is a second circuit diagram in accordance with embodiments of the present invention.

FIG. 2 shows an optical receiver 200, comprising a RSSI circuit 210 and the TIA 110 of FIG. 1. The optical receiver 200 may further include the hysteresis circuit 150. Since optical signals from other optical transmitters in the network may have any of a wide range of signal strengths (e.g., from −6 dBm to −34 dBm, from −8 dBm to −22 dBM, etc.), the RSSI circuit 210 should advantageously have good sensitivity over a wide range of signal strengths. When the optical input power is less than a medium threshold (such as −18 dBm), the amplifier should have a high gain (in which case the switch 130 may be off). Such a configuration is very helpful for ADC sampling, and provides improved accuracy (e.g., which is useful for an RSSI monitor). However, when the optical input power is higher than the medium threshold, especially in an overload range or section (such as at or near −6 dBm), the amplifier (e.g., amplifier 112 in FIG. 1) is saturated, so it is difficult for the analog-to-digital converter (e.g., ADC 214 in FIG. 2) to get linear sampling data when the amplifier gain is high. Turning the switch 130 off at this time lowers the gain and enables the ADC to get relatively linear sampling data. Other components in FIG. 2 having the same identification number as in FIG. 1 is the same or substantially the same as in FIG. 1, and duplicate descriptions thereof may be avoided or minimized.

One input terminal of the hysteresis circuit 150 connects to the resistor R5, which receives a reference voltage Vref, and another input terminal of the hysteresis circuit 150 connects to the resistor R4, which receives an output of an analog amplifier circuit 260 (e.g., amplifier 262), which has an impedance controlled by the resistor R3. One input terminal of the amplifier 262 is connected to a current 142 from the photodiode 140, and another input terminal of the amplifier 262 receives a current or voltage resulting from the drop across resistor R6.

The TIA 110 receives a mirrored current at one input and a reference voltage Vref1 at another input. The mirrored current may be duplicated from (e.g., the same as, or an integer multiple or fraction of) the current at the second (negative) input to the amplifier 262. The output terminal of the TIA connects to a sample-and-hold circuit 212 and an ADC 214 in the RSSI circuit 210. The ADC 214 is in a MCU 216, which may also include a memory and/or a RSSI processor (not shown)

The hysteresis circuit 150 provides a buffer zone for the switch 130, so that the gain range of the TIA 110 can change smoothly and/or transfer its status (e.g., high impedance vs. low impedance) and/or gain range without significant adverse effects. As shown in FIG. 3, when the output of the analog amplifier 262 is at or below the low predetermined voltage Vil, the hysteresis circuit 150 outputs an active digital control signal (e.g., a logic one), thereby turning the switch 130 on. When the output of the analog amplifier 262 transitions to or above the high predetermined voltage Vih, the hysteresis circuit 150 outputs an inactive digital control signal (e.g., a logic zero), thereby turning the switch 130 off. When the input voltage to the hysteresis circuit 150 is between Vih and Vil, the output status of hysteresis circuit will keep the same status. The high and low predetermined voltages Vih and Vil of the hysteresis circuit 150 are set by R4, R5 and Rf.

An Exemplary Optical Transceiver

Figure 4:
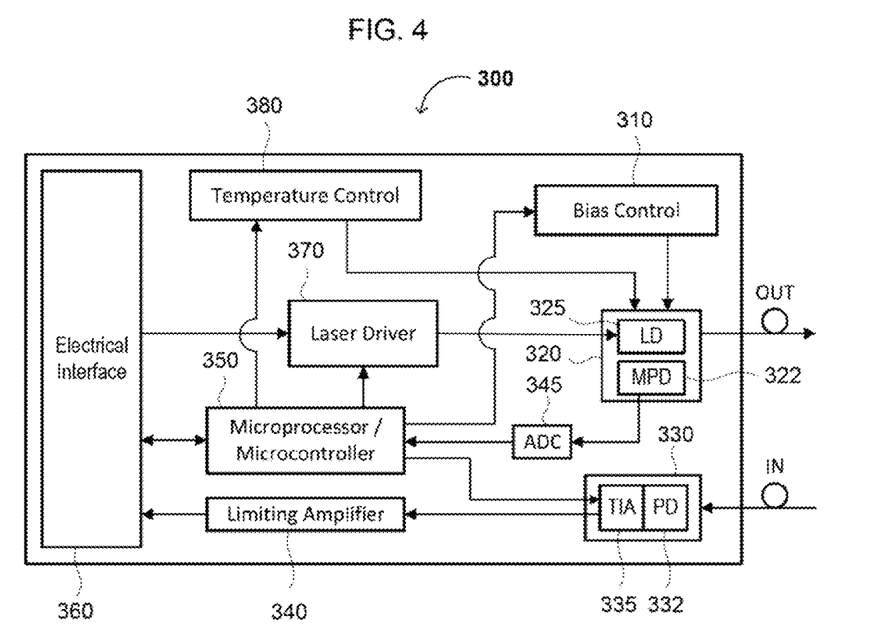
FIG. 4 shows an exemplary transceiver including a TIA in accordance with embodiments of the present invention.

FIG. 4 illustrates an exemplary optical transceiver (e.g., a SFP+ transceiver) 300 comprising a receiver optical sub assembly (ROSA) 330 and a transmitter optical subassembly (TOSA) 320. ROSA 330 comprises a transimpedance amplifier (TIA) 335 and a photodiode (PD) 332. For example, the PD 332 may comprise a p-type intrinsic n-type (PIN) photodiode. ROSA 330 is configured to receive an optical input signal IN (e.g., from an optical signal medium such as a fiber optic cable) and provide an electrical output signal to a limiting amplifier 340. Limiting amplifier 340 is configured to provide an amplified output signal to electrical interface 360, and in communication with electrical interface 360, limit the voltage of the input signal. Electrical interface 360 is coupled to a microprocessor 350 via one or more buses, and provides one or more signals (e.g., from an electrical component in communication with transceiver 300, such as a host device) to the microprocessor 350. Microcontroller 350 is configured to control and/or regulate various functions of the transceiver modules (e.g., temperature control circuit 380, laser driver circuit 370, bias control circuit 310, etc.). Furthermore, transceiver 300 comprises a PWM bias current control circuit 310, which is used for laser bias current generation with low-power consumption. The bias control circuit 310 may comprise a DC/DC converter that provides a bias current for the laser diode (LD) 325.

As shown, the laser driver circuit 370 is connected between the electrical interface 360 and the laser 325. The TOSA 320 may comprise LD 325 and a monitoring photodiode (MPD) 322. The LD 325 may comprise a distributed feedback (DFB) laser diode and an electro-absorption (EA) modulator, in one embodiment. TOSA 320 provides an optical output signal OUT.

Microprocessor/microcontroller 350 maintains a desired or predetermined optical output power (e.g., signal OUT provided by TOSA 320) by controlling the bias control circuit 310, which generates a bias current for the LD 325. The electrical data signal received by the laser driver 370 comes from the electrical interface 360, and an amplification or modulation amplitude of the laser driver 370 is controlled by microprocessor/microcontroller 350. The amplified electrical data signal is applied to the laser 322 to achieve the optical output signal OUT. Furthermore, temperature control of the laser 325 is maintained through a temperature control feedback loop. Specifically, microcontroller 350 uses analog-to-digital converter (ADC) 345 to monitor the temperature of the LD 325. Microcontroller 350 then processes (e.g., compares) the temperature data with a predetermined or desired temperature setting to provide temperature difference data to the temperature control circuit 380, which effectively cools or heats the laser diode 325. Incoming optical data signal IN goes into ROSA 330, which converts the optical signal IN to an electrical signal, which is amplified by the TIA 335 (which may be one of the TIAs described herein) and the limiting amplifier 340 before entering the electrical interface 360.

An Exemplary Method

Figure 5:
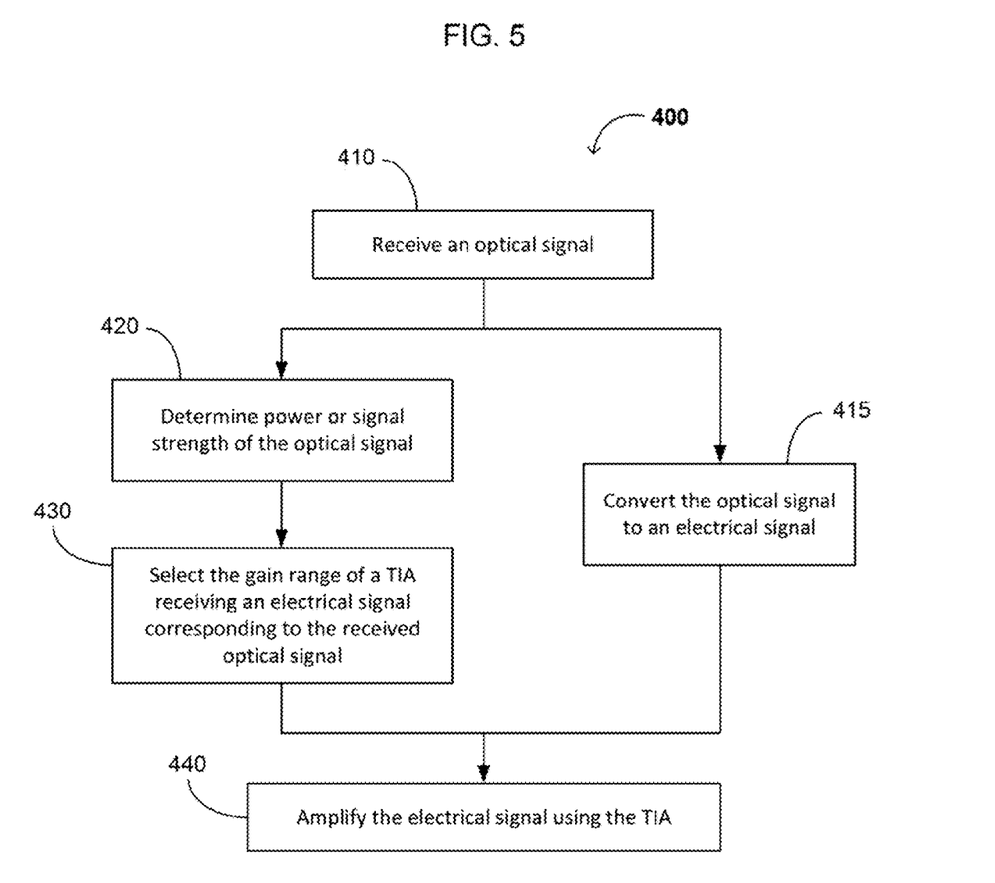
FIG. 5 shows a flow chart of an exemplary method of selecting a gain range for a transimpedance amplifier (TIA) and/or amplifying an electrical signal in an optical receiver from a received optical signal.

The present invention also relates to an exemplary method of selecting a gain range for a transimpedance amplifier (TIA) and/or amplifying an electrical signal in an optical receiver from a received optical signal. FIG. 5 shows a flow chart 400 of such an exemplary method.

At 410, an optical signal is received by the optical receiver. For example, at 415, a photodiode in a ROSA of an optical transceiver receives the optical signal and converts it to an electrical signal.

At 420, the power or signal strength of the optical signal is determined, as described herein. Perhaps more accurately, a voltage or current corresponding to the power or signal strength of the optical signal is determined, as described herein (e.g., by comparing the voltage or current to one or more high and/or low predetermined thresholds in a hysteresis circuit).

At 430, the gain range of a TIA receiving the electrical signal (i.e., corresponding to the received optical signal) is selected, based on the power or signal strength of the optical signal. In exemplary embodiments disclosed herein, a control voltage is applied to one or more switches that control a resistance and/or impedance of an impedor that, in turn, controls the resistivity and/or impedance (and thus the gain range) of the TIA. In certain embodiments, the control voltage is generated by the hysteresis circuit in response to the comparison of the voltage or current to one or more predetermined thresholds (e.g., high and/or low predetermined thresholds).

At 440, the electrical signal is amplified using the TIA having the gain range selected by the hysteresis circuit and control voltage, as described herein. The method may repeat upon reception of a different optical signal.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A trans-impedance amplifier (TIA) with a dynamic range, comprising:

a current amplifier configured to produce an amplified voltage signal from a received current corresponding to a power of a received optical signal, wherein the current amplifier has a reference voltage input terminal, an input terminal and an output terminal; and an impedor between the input terminal and the output terminal of the current amplifier, wherein the impedor has a resistance configured to regulate a resistance and/or impedance value of the TIA;

one or more switches configured to determine the resistance of the impedor, wherein the one or more switches are enabled or disabled by a control voltage; and a hysteresis circuit configured to regulate the control voltage by comparing an input voltage corresponding to the received current with a high predetermined value and a low predetermined value, the hysteresis circuit comprising (1) an amplifier having a first input terminal, a second input terminal and an output terminal and (2) a first resistor connected between the first input terminal and the output terminal of said amplifier;

wherein when the input voltage is higher than the high predetermined value, the impedor has a first resistance, when the input voltage is lower than the low predetermined value, the impedor has a second resistance greater than the first resistance.

2. The trans-impedance amplifier (TIA) of claim 1, wherein the impedor comprises N parallel resistors between the input terminal and the output terminal of the current amplifier, N being an integer of 2 or more.

3. The trans-impedance amplifier (TIA) of claim 2, wherein the impedor comprises (i) a second resistor connected to each of the input terminal and the output terminal of the current amplifier, and (ii) a third resistor connected to one of the input terminal and the output terminal of the current amplifier, and a first one of the one or more switches being connected to a first terminal of the third resistor and the other of the input terminal and the output terminal of the current amplifier.

4. The trans-impedance amplifier (TIA) of claim 3, wherein the second resistor has a first resistance, the third resistor has a second resistance, and a ratio of the first resistance to the second resistance is from 1:5 to 1:10.

5. The trans-impedance amplifier (TIA) of claim 2, wherein N=2.

6. The trans-impedance amplifier (TIA) of claim 1, wherein the high and low predetermined values are configured by a plurality of hysteresis resistors.

7. The trans-impedance amplifier (TIA) of claim 1, wherein when the input voltage is greater than the high predetermined value, the control voltage from the hysteresis circuit will turn on or enable one of the one or more switches, and when the input voltage circuit is less than the low predetermined value, the control voltage will turn off or disable the one of the one or more switches.

8. The trans-impedance amplifier (TIA) of claim 1, wherein the hysteresis circuit further comprises:

a fourth resistor connected in series to the second input terminal of the amplifier; and a fifth resistor configured to connect a reference voltage to the first input terminal of the amplifier.

9. The trans-impedance amplifier (TIA) of claim 8, further comprising a current mirror and a boost circuit, wherein the amplifier of the hysteresis circuit receives an output from the current mirror.

10. An optical receiver, comprising the trans-impedance amplifier (TIA) of claim 1, and a microcontroller, processor or logic circuit configured to regulate a reference voltage on the reference voltage input terminal.

11. An optical receiver, comprising the trans-impedance amplifier (TIA) of claim 1, and a photodiode connected to the input terminal of the current amplifier.

12. The optical receiver of claim 11, wherein the photodiode is further connected to a current mirror, and the current mirror is connected to a boost circuit and has one output terminal connected to an input of the hysteresis circuit.

13. The optical receiver of claim 12, wherein the high predetermined value is a first predetermined voltage threshold corresponding to an optical signal power of −15 dBm, and the low predetermined value is a second predetermined voltage threshold corresponding to an optical signal power of −20 dBm.

14. A received signal strength indicator (RSSI), comprising the TIA of claim 1; a photodiode; and an analog amplifier circuit having an input terminal configured to receive a current equal or proportional to the received current; wherein the first input terminal of the hysteresis circuit is further connected to a reference voltage and the second input terminal is connected to the analog amplifier circuit.

15. An optical receiver comprising the received signal strength indicator of claim 14.

16. A method of receiving and/or amplifying an optical signal, comprising:
  a) receiving the optical signal in an optical receiver;
  b) converting the optical signal to an electrical signal;
  c) determining a power or signal strength of the optical signal;
  d) comparing an input voltage corresponding to the electrical signal with a high predetermined value and a low predetermined value using a hysteresis circuit, the hysteresis circuit comprising (1) an amplifier having a first input terminal, a second input terminal and an output terminal and (2) a third resistor connected between the first input terminal and the output terminal of said amplifier;
  e) selecting a first resistance and/or impedance value of a transimpedance amplifier (TIA) receiving the electrical signal when the input voltage is higher than the high predetermined value and a second resistance and/or impedance value of the TIA greater than the first resistance and/or impedance value when the input voltage is lower than the low predetermined value; and
  f) amplifying the electrical signal using the TIA.

17. The method of claim 16, wherein the electrical signal is a current from a photodiode receiving the optical signal, and selecting the first or second resistance and/or impedance value further comprises generating a control voltage and applying the control voltage to one or more switches that control a resistance and/or impedance of an impedor that, in turn, controls a gain range of the TIA.

18. An optical receiver, comprising a trans-impedance amplifier (TIA) and a photodiode connected to the input terminal of the current amplifier, wherein:
  the TIA has a dynamic range and comprises:
    a current amplifier configured to produce an amplified voltage signal from a received current corresponding to a power of a received optical signal, wherein the current amplifier has a reference voltage input terminal, an input terminal and an output terminal; and
    an impedor between the input terminal and the output terminal of the current amplifier, wherein the impedor has a resistance configured to regulate a resistance and/or impedance value of the TIA;
    a switch configured to determine the resistance of the impedor, wherein the switch is enabled or disabled by a control voltage; and
    a hysteresis circuit configured to regulate the control voltage by comparing an input voltage with a high predetermined value and a low predetermined value, wherein when the input voltage is greater than the high predetermined value, the control voltage enables the switch, and when the input voltage is less than the low predetermined value, the control voltage disables the switch.

19. The optical receiver of claim 18, wherein the hysteresis circuit comprises (1) an amplifier having a first input terminal, a second input terminal and an output terminal and (2) a first resistor connected between the first input terminal and the output terminal of said amplifier.

20. The optical receiver of claim 18, wherein when the switch is enabled, the impedor has a first resistance, and when the switch is disabled, the impedor has a second resistance greater than the first resistance.

* * * * *

UNITED STATES PATENT AND TRADEMARK OFFICE
CERTIFICATE OF CORRECTION

PATENT NO. : 9,628,195 B2
APPLICATION NO. : 14/522384
DATED : April 18, 2017
INVENTOR(S) : Xu Jiang et al.

Page 1 of 1

It is certified that error appears in the above-identified patent and that said Letters Patent is hereby corrected as shown below:

In the Claims

Claim 1, Column 10, Line 5: remove the word "and" (second occurrence).

Claim 18, Column 12, Line 12: change the word "the" to "a".

Claim 18, Column 12, Line 13: change the word "the" to "a".

Claim 18, Column 12, Line 15: change the word "a" to "the".

Claim 18, Column 12, Line 19: change the word "an" to "the" (first occurrence), and remove the word "and" (second occurrence).

Signed and Sealed this
Thirtieth Day of April, 2019

Andrei Iancu
*Director of the United States Patent and Trademark Office*